United States Patent [19]

Egerbacher et al.

[11] Patent Number: 4,833,522
[45] Date of Patent: May 23, 1989

[54] SEMICONDUCTOR MODULE

[75] Inventors: Werner Egerbacher; Herbert Vogt, both of Munich; Dieter Wunderlich, Olching, all of Fed. Rep. of Germany

[73] Assignee: Siemens Aktiengesellschaft, Berlin and Munich, Fed. Rep. of Germany

[21] Appl. No.: 526,554

[22] Filed: Aug. 25, 1983

[30] Foreign Application Priority Data

Aug. 30, 1982 [DE] Fed. Rep. of Germany ....... 3232157

[51] Int. Cl.$^4$ .................. H01L 23/02; H01L 23/12
[52] U.S. Cl. ....................................... 357/74; 357/75
[58] Field of Search .................. 357/74, 75; 339/17 N, 339/102 R, 119 R

[56] References Cited

U.S. PATENT DOCUMENTS 3,940,786 2/1976 Scheirgold et al. ................. 357/74
4,047,197 9/1977 Schierz ................................ 357/75

OTHER PUBLICATIONS

Siemens Aktiengesellschaft Data Book "Thyodul-, Diodul-Module", 1980/81, p. 8, FIG. 6.

Primary Examiner—William L. Sikes
Assistant Examiner—Robert E. Wise
Attorney, Agent, or Firm—Herbert L. Lerner; Laurence A. Greenberg

[57] ABSTRACT

Semiconductor module, including a metallic bottom plate, at least two semiconductor bodies disposed on the bottom plate, at least one of the semiconductor bodies being a thyristor tablet having at least one control electrode, a frame having an inner surface, the frame being connected to the bottom plate and surrounding the semiconductor bodies, at least one control line for each thyristor tablet having first and second sections, each of the first sections being firmly connected to a respective one of the control electrodes and having an end facing away from the one control electrode, the ends each being adjacent the inner surface of the frame and including a contact region, each of the second sections being mechanically connected to the frame and having a contact region in contact with the contact region of a respective one of the first sections, and the second sections each including a contact terminal accessible from outside the module.

9 Claims, 1 Drawing Sheet

SEMICONDUCTOR MODULE

The invention relates to a semiconductor module with at least two semiconductor bodies disposed on a metallic bottom plate, at least one of which is a thyristor pellet or tablet with at least one control electrode, a frame connected to the bottom plate and surrounding the semiconductor bodies, and at least one control line for each thyristor tablet, the control lines being connected to a terminal which is accessible from the outside.

Such a semiconductor module is known, for instance, from Siemens Data Book "Modules 1980/81", page 8, FIG. 6. In such modules, the control electrodes of the thyristor pellets or tablets must be accessible, which requires relatively long control lines in view of the long distance between the control electrode and the terminal, depending on the form of the housing. This can lead to difficulties in assembly as well as in casting full of synthetic resin compound if, for instance, the control lines are guided in the form of insulated braids which are free in the interior of the housing. These control lines must then in general be soldered to a contact lug connected to the control electrode and to the terminal, which requires relatively time-consuming manual labor.

It is accordingly an object of the invention to provide a semi-conductor module which overcomes the hereinafore-mentioned disadvantages of the heretofore-known devices of this general type, and to do so in such a way that the electrical connection between the control electrode of the thyristor pellet or tablet and the terminal accessible from the outside, can be made in a simpler manner.

With the foregoing and other objects in view, there is provided, in accordance with the invention, a semiconductor module including a metallic bottom plate, at least two semiconductor bodies disposed on the bottom plate, at least one of the semiconductor bodies being a thyristor tablet or pellet having at least one control electrode, a frame having an inner surface, the frame being connected to the bottom plate and surrounding the semiconductor bodies, at least one control line for each thyristor table having first and second sections, each of the first sections being firmly connected to a respective one of the control electrodes and having an end facing away from the one control electrode, the ends each being adjacent the inner surface of the frame and including a contact area or region, each of the second sections being mechanically connected to the frame and having a contact region or area in contact with the contact region of a respective one of the first sections, and the second sections each including a contact terminal accessible from outside the module.

In accordance with another feature of the invention, each of the second sections is a stamped sheet metal part.

In accordance with a further feature of the invention, guide rails are disposed on the inner surface of the frame holding the second sections in place.

In accordance with an additional feature of the invention, guide projections are disposed on the inner surface of the frame and on the second sections for holding the second sections in place.

In accordance with an added feature of the invention, the second sections each have a wave or protruding piece on which the contact regions of the second sections are disposed.

In accordance with yet another feature of the invention, the frame includes a longitudinal wall, and the second sections are disposed at the inner surface of the longitudinal wall.

In accordance with yet a further feature of the invention, the frame has a side facing away from the bottom plate, and the contact terminals protrude from the side of the frame, and including at least three guide rails or projections disposed on the inner surface of the frame alternatingly above and below the second sections for holding the second sections.

Other features which are considered as characteristic for the invention are set forth in the appended claims.

Although the invention is illustrated and described herein as embodied in semiconductor module, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings, in which.

Figure 1:
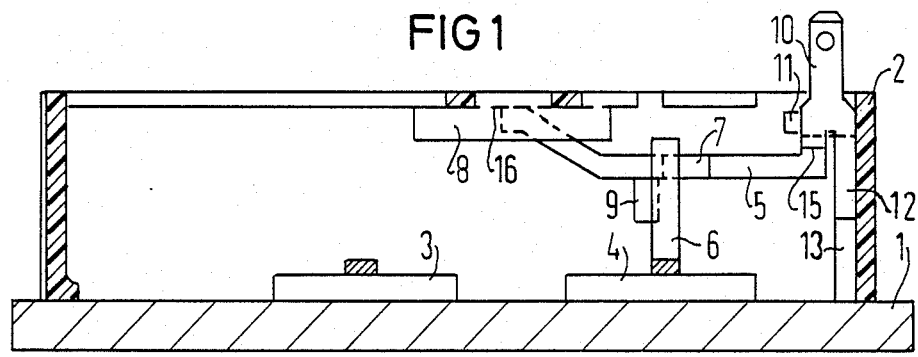
FIG. 1 is a diagrammatic, greatly simplified, cross-sectional view of a semiconductor module taken along the line I—I in FIG. 2, in the direction of the arrows.
Figure 2:
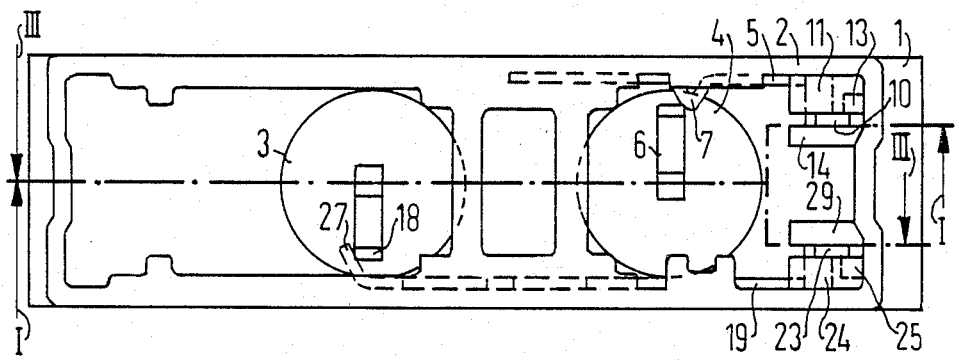
FIG. 2 is a top plan view of the module of FIG. 1.
Figure 3:
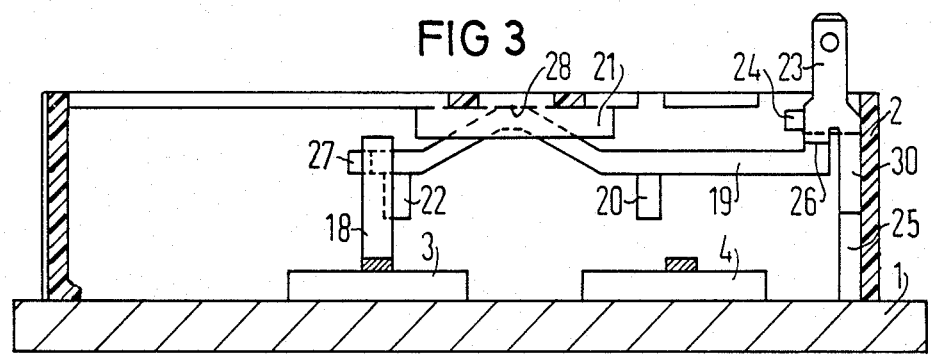
FIG. 3 is a view similar to FIG. 1, taken along the line III—III in FIG. 2, in the direction of the arrows.

Referring now in detail to FIGS. 1-3 of the drawing as a whole, it is seen that the semiconductor module has a metallic bottom plate 1, on which two semiconductor bodies 3, 4 are disposed. The semiconductor bodies are thyristor tablets or pellets with one non-illustrated control electrode each. The thyristor tablets are enclosed by a frame 2 which is formed of insulating material and is connected to the bottom plate 1. The thyristor tablets are in thermal contact with the bottom plate 1 but may be electrically insulated from the bottom, such as by ceramic discs. The cathode and anode contacts of the thyristor tablets are likewise not illustrated for the sake of greater clarity.

The control electrode of the thyristor tablet 4 is firmly connected to a conductor 6. This conductor which represents the first section of the control line is formed by a punch-out sheet metal strip 5 which is held at the inner surface of one of the longitudinal walls of the frame 2. To this end, the frame 2 has a guide rail 8 at its inner surfaces into which the end of the sheet metal strip 5 is inserted. Further fastening elements are provided in the form of a guide projection 9 disposed on the lower surface of the sheet metal strip 5 as well as a projection 11. The sheet metal strip 5 carries a contact terminal 10. An offset 15 is disposed at the base of the contact terminal 10, perpendicular to the plane of the drawing. The offset 15 rests against the projection 11 from below. On the other side, the sheet metal strip 5 rests against a stop 16 provided in the guide rail. In this way, the sheet metal strip 5 is secured against twisting perpendicular to the plane of the drawing, a first guide rail 13 and a second guide rail 14 are provided at a transverse wall of the frame. The contact terminal 10 is inserted into the space between the two guide rails 13, 14. To improve the guidance, the contact terminal 10 may, furthermore, have an extension 12 which extends away from the contact terminal into the interior of the housing.

The first section 6 of the control line may be formed of a piece of copper strip. The end of the first section 6 facing away from the control electrode of the semiconductor body 4 is adjacent the longitudinal wall of the frame 2. At the end of this section 6, the sheet metal strip 5 has an area provided for making contact with the section 6. The contact area is formed by a wave 7 formed in the sheet metal strip 5. When the frame 2 with the control contact 10 and the second section 5 of the control line are put in place, the contact between the two sections 5 and 6 of the control line for the thyristor tablet 4 is established. The connection can be constructed as a plug contact, for instance, in such a manner that the end of the section 6 facing away from the control electrode of the tablet 4 has a spring tab which fits into the wave 7. A simpler and more durable connection is obtained by soldering the two parts together.

The control line for the thyristor pellet or table 3, is formed of two parts like the control line for the thyristor pellet or tablet 4. The control line which is namely formed of a first section 18 is a punched-out sheet metal strip and carries a contact terminal 23. The sheet metal strip 19 sits in a guide rail 21 and is held by two guide projections 20, 22 attached to the inner surface of the frame 2. The second section 19 is in connection with a stop 28 provided in the guide rail 21 and is secured against rotation. At the base of the contact terminal 23, the sheet metal strip 19 rests against a projection 24 with an ofset 26 lying in the plane of the drawing. The fixation of the contact terminal 23 is ensured by the guide rails 25 and 29 provided at the above-mentioned transverse wall of the frame 2. The contact terminal 23 may have an extension 30 directed toward the interior of the housing for improving the guidance.

The end of the first section 18 of the control line facing away from the control contact of the thyristor tablet 3 is adjacent the inner surface of one of the longitudinal walls of the frame 2. The section 18 in this embodiment contacts the end of the strip 19 at a surface provided for making mutual contact. This contact surface may lie, for instance, on a protruding portion 27 of the sheet metal strip 19. However, instead of the portion 27, a wave and possibly a plug connection could also be provided in this embodiment. In the structure shown, the contact is made by soldering.

The mounting of the sheet metal strips 5 and 19 can also be accomplished in a manner other than by using projections and guide rails. For instance, it is conceivable to place the sheet metal strips in respective slots provided on the inner surface of the frame and to cement them there. In that case, only the areas provided for making contact with the first sections coming from the control electrodes, protrude from the slot. Instead of the punched-out sheet metal strip 5, 19, cylindrical copper lines which lie in a slot at the surface of the frame, for instance, could also be used.

The above-mentioned second sections can also be molded into the longitudinal walls when the frame is made.

The foregoing is a description corresponding, in substance, to German application No. P32 32 157.0, dated Aug. 30, 1982, international priority of which is being claimed for the instant application, and which is hereby made part of this application. Any material discrepancies between the foregoing specification and the specification of the aforementioned corresponding German application are to be resolved in favor of the latter.

There is claimed:

1. Semiconductor module, comprising a metallic bottom plate, at least two semiconductor bodies disposed on said bottom plate, at least one of said semiconductor bodies being a thyristor tablet having at least one control electrode, a frame having a longitudinal wall with an inner surface and guide rails on said inner surface, said frame being connected to said bottom plate and surrounding said semiconductor bodies, at least one control line for each thyristor tablet having first and second sections, each of said first sections being firmly connected to a respective one of said control electrodes and having an end facing away from said one control electrode, said ends each being adjacent said inner surface of said longitudinal wall and including a contact region, each of said second sections being mechanically connected to said inner surface of said frame by said guide rails, each of said second sections having a contact region in contact with said contact region of a respective one of said first sections, and said second sections each including a contact terminal accessible from outside the module.

2. Semiconductor module according to claim 1, wherein each of said second sections is a stamped sheet metal part.

3. Semiconductor module according to claim 2, wherein said frame has a side facing away from said bottom plate, and said contact terminals protrude from said side of said frame, and including at least three guide projections disposed on said inner surface of said frame alternatingly above and below said second sections for holding said second sections.

4. Semiconductor module according to claim 1, wherein said second sections each have a wave on which said contact regions of said second sections are disposed.

5. Semiconductor module according to claim 1, wherein said sections each have a protruding piece on which said contact regions of said second sections are disposed.

6. Semiconductor module according to claim 1, wherein said frame has a side facing away from said bottom plate, and said contact terminals protrude from said side of said frame and said guide rails include at least three guide rails disposed on said inner surface of said frame alternatingly above and below said second sections for holding said second sections.

7. Semiconductor module, comprising a metallic bottom plate, at least two semiconductor bodies disposed on said bottom plate, at least one of said semiconductor bodies being a thyristor tablet having at least one control electrode, a frame having a longitudinal wall with an inner surface and guide projections. on said inner surface, said frame being connected to said bottom plate and surrounding said semiconductor bodies, at least one control line for each thyristor tablet having first and second sections, each of said first sections being firmly connected to a respective one of said control electrodes and having an end facing away from said one control electrode, said ends each being adjacent said inner surface of said longitudinal wall and including a contact region, each of said second sections being mechanically connected to said inner surface by said guide projections, each of said second sections having a contact region in contact with said contact region of a respective one of said first sections, and said second sections each including a contact terminal accessible from outside the module.

8. Semiconductor module, comprising a metallic bottom plate, at least two semiconductor bodies disposed on said bottom plate, at least one of said semiconductor bodies being a thyristor tablet having at least one control electrode, a frame having a longitudinal wall with an inner surface, said frame being connected to said bottom plate and surrounding said semiconductor bodies, at least one control line for each thyristor tablet having first and second sections, each of said first sections being firmly connected to a respective one of said control electrodes and having an end facing away from said one control electrode, said ends each being adjacent said inner surface of said longitudinal wall and including a contact region, said inner surface having at least one slot formed therein, each of said second sections being cemented in one of said slots, each of said second sections having a contact region in contact with said contact region of a respective one of said first sections, said contact regions of said second sections protruding from said slot and said second sections each including a contact terminal accessible from outside the module.

9. Semiconductor module, comprising a metallic bottom plate, at least two semiconductor bodies disposed on said bottom plate, at least one of said semiconductor bodies being a thyristor tablet having at least one control electrode, a frame having a longitudinal wall with an inner surface, said frame being connected to said bottom plate and surrounding said semiconductor bodies, at least one control line for each thyristor tablet having first and second sections, each of said first sections being firmly connected to a respective one of said control electrodes and having an end facing away from said one control electrode, said ends each being adjacent said inner surface of said longitudinal wall and including a contact region, said second sections being molded into said longitudinal wall, each of said second sections having a contact region in contact with said contact region of a respective one of said first sections, said first mentioned contact region protruding from said wall and said second sections each including a contact terminal accessible from outside the module.

* * * * *